US012796549B2

United States Patent
(12) United States Patent
Zhang et al.

(10) Patent No.: US 12,796,549 B2
(45) Date of Patent: Nov. 10, 2026

(54) SEMICONDUCTOR STRUCTURE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 555 days.

(21) Appl. No.: 18/252,347

(22) PCT Filed: Nov. 18, 2020

(86) PCT No.: PCT/CN2020/129774

§ 371 (c)(1),
(2) Date: May 9, 2023

(87) PCT Pub. No.: WO2022/104594

PCT Pub. Date: May 27, 2022

(65) Prior Publication Data

US 2023/0420434 A1 Dec. 28, 2023

(51) Int. Cl.
*H10W 90/00* (2026.01)
*H10H 20/814* (2025.01)
(Continued)

(52) U.S. Cl.
CPC .......... *H10W 90/00* (2026.01); *H10H 20/814* (2025.01); *H10H 20/819* (2025.01); *H10H 20/825* (2025.01)

(58) Field of Classification Search
None
See application file for complete search history.

(56) References Cited

U.S. PATENT DOCUMENTS

2005/0145872 A1 7/2005 Fang et al.
2009/0114935 A1* 5/2009 Huang ................ H10H 20/814
438/32

(Continued)

FOREIGN PATENT DOCUMENTS

CN 101442090 A 5/2009
CN 101859856 A 10/2010

(Continued)

OTHER PUBLICATIONS

ISA State Intellectual Property Office of the People's Republic of China, International Search Report Issued in Application No. PCT/CN2020/129774, Aug. 17, 2021, WIPO, 4 pages.

(Continued)

*Primary Examiner* — Bradley Smith
(74) *Attorney, Agent, or Firm* — Carroll, Hoette & Butscher, LLC; Christopher R. Carroll

(57) ABSTRACT

A semiconductor structure includes: a stacked structure, including one stacked structure unit or a plurality of stacked structure units disposed along a horizontal direction, where each of the stacked structure units includes a plurality of stacked island structures separated from each other along the horizontal direction; and an N-type semiconductor layer, a light-emitting layer and a P-type semiconductor layer sequentially laminated on the stacked structure. In the present disclosure, by providing the stacked structure, the light-emitting efficiency of the semiconductor device can be improved.

16 Claims, 9 Drawing Sheets

(51) Int. Cl.
*H10H 20/819* (2025.01)
*H10H 20/825* (2025.01)

(56) References Cited

U.S. PATENT DOCUMENTS

| | | | | |
|---|---|---|---|---|
| 2012/0190148 A1* | 7/2012 | Lin | H10H 20/018 | 438/46 |
| 2012/0292649 A1* | 11/2012 | Sugiyama | H01L 21/02458 | 257/629 |
| 2016/0126422 A1* | 5/2016 | Jeon | H10H 20/831 | 257/98 |
| 2017/0104129 A1* | 4/2017 | Jain | H10H 20/812 | |

FOREIGN PATENT DOCUMENTS

| | | |
|---|---|---|
| CN | 201773861 U | 3/2011 |
| CN | 103035797 A | 4/2013 |

OTHER PUBLICATIONS

ISA State Intellectual Property Office of the People's Republic of China, Written Opinion of the International Searching Authority Issued in Application No. PCT/CN2020/129774, Aug. 17, 2021, WIPO, 6 pages. (Submitted with Machine/Partial Translation).

State Intellectual Property Office of the People's Republic of China, Office Action and Search Report Issued in Application No. 2020801072053, Feb. 11, 2025, 12 pages. (Submitted with Machine Translation).

* cited by examiner

SEMICONDUCTOR STRUCTURE

CROSS-REFERENCE TO RELATED APPLICATIONS

This application is a national phase entry of International Patent Application No. PCT/CN2020/129774 (filed 18 Nov. 2020), the entire disclosure of which is incorporated herein by reference.

TECHNICAL FIELD

The present disclosure relates to the field of semiconductors and in particular to a semiconductor structure.

BACKGROUND

At present, during a manufacture process of light-emitting diode (LED) photoelectric devices, due to shortage of gallium nitride intrinsic substrate, the LED photoelectric devices are all manufactured on a heterogeneous substrate, for example, sapphire, silicon carbide and silicon.

However, due to a high refractive index of gallium nitride, most of the light rays hitting on the surface of the LED photoelectric devices are reflected, such that a huge number of light rays are confined within a chip, leading to a low light-emitting efficiency.

Therefore, how to further improve the luminous efficiency of LED light-emitting devices is still an urgent problem to be solved.

SUMMARY

The present disclosure provides a semiconductor structure that can improve the light-emitting efficiency of the semiconductor device.

In order to achieve the above purpose, according to an embodiment of the present disclosure, there is provided a semiconductor structure which includes:

- a stacked structure, including one stacked structure unit or a plurality of stacked structure units disposed along a horizontal direction, where each stacked structure unit includes stacked island structures separated from each other along the horizontal direction; and
- an N-type semiconductor layer, a light-emitting layer and a P-type semiconductor layer sequentially laminated on the stacked structure.

Optionally, the stacked structure is a photonic crystal structure.

Optionally, when a plurality of stacked structure units are disposed, the adjacent stacked structure units are partially overlapped; or the adjacent stacked structure units are separated from each other.

Optionally, one of the stacked island structures includes a buffer layer and a first semiconductor layer sequentially laminated.

Optionally, one of the stacked island structures includes second semiconductor layers and third semiconductor layers laminated alternately;

a material of the second semiconductor layers is $Al_{x1}In_{y1}Ga_{1-x1-y1}N$, and a material of the third semiconductor layers is $Al_{x2}In_{y2}Ga_{1-x2-y2}N$, wherein X1, Y1, X2 and Y2 are valued from 0 to 1.

Optionally, the stacked structure units are smallest repeating units to form the stacked structure;

each of the stacked structure units includes at least three stacked island structures separated from each other along the horizontal direction.

Optionally, a shape of a section of one of the stacked island structures is a circle or a polygon.

Optionally, if the section of the one of the stacked island structures is a circle, the section of the one of the stacked island structures has a diameter of less than or equal to 50 μm;

if the section of the one of the stacked island structures is a polygon, a minimum circumcircle of the section of the one of the stacked island structures has a diameter of less than or equal to 50 μm.

Optionally, a gap is present between adjacent stacked island structures, and a recess concaved away from the stacked structure is further formed at a side of the N-type semiconductor layer in contact with the stacked structure, where the recess is formed corresponding to the gap.

Optionally, the stacked structure, the N-type semiconductor layer, the light-emitting layer and the P-type semiconductor layer are manufactured by an epitaxial process.

Optionally, the semiconductor structure further includes a substrate and a nucleation layer;

- along a vertical direction, the nucleation layer is disposed between the substrate and the stacked structure and provided with grooves to form a plurality of nucleation-layer-middle-islands separated from each other along the horizontal direction, where each stacked island structure corresponds to one nucleation-layer-middle-island.

Optionally, a material of the substrate is sapphire, silicon, silicon carbide or gallium nitride.

Optionally, the semiconductor structure further includes:

- a reflection layer, where along the vertical direction, the reflection layer is disposed at a side of the P-type semiconductor layer away from the light-emitting layer; and
- a transfer layer, where along the vertical direction, the transfer layer is disposed at a side of the reflection layer away from the P-type semiconductor layer.

Optionally, the reflection layer and the transfer layer are manufactured by a chip process.

Optionally, the reflection layer is a metal layer.

Optionally, a material of the metal layer is Ag; or,

- the metal layer includes a first metal layer and a second metal layer laminated, where a material of the first metal layer is Ni and a material of the second metal layer is Ag.

Optionally, the reflection layer includes at least one of an indium tin oxide layer or a DBR layer laminated.

Optionally, the DBR layer is formed by alternately laminating first material layers made of titanium oxide and second material layers made of silicon oxide.

In the semiconductor structure of the above embodiments, the stacked structure is provided in which the stacked island structures are disposed in different arrangement periods to achieve selective reflection on light. Since the stacked island structures enable the stacked structure to have a photonic energy band structure, the color of the reflected light changes due to different energy gap positions, so as to finally improve the light-emitting efficiency of the semiconductor structure.

DETAILED DESCRIPTION OF THE EMBODIMENTS

Figure 1:
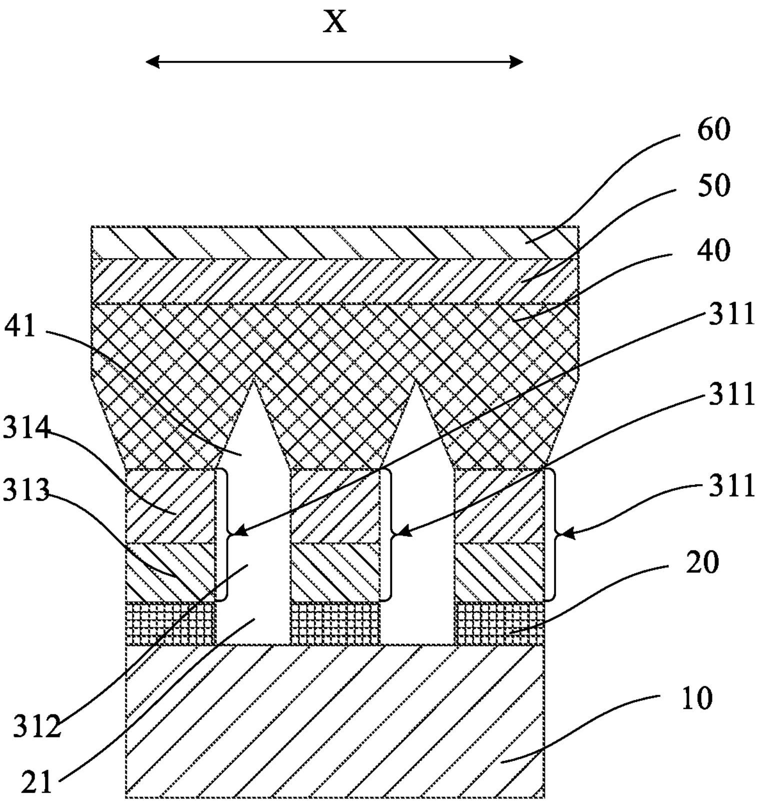
FIG. 1 is a schematic diagram illustrating a sectional structure of a semiconductor structure along a vertical direction according to an embodiment 1 of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

Terms used herein are used to only describe a particular embodiment rather than limit the present disclosure. Unless otherwise defined, technical terms or scientific terms used in the present disclosure should have general meanings that can be understood by those skilled in the art. The terms “a” or “an” and the like do not represent quantity limitation but represent at least one. The term “include” or “contain” or the like is intended to refer to that an element or object appearing before “include” or “contain” covers an element or object or its equivalents listed after “include” or “contain” and does not preclude other elements or objects. “Connect” or “connect with” or the like is not limited to physical or mechanical connection but includes direct or indirect electrical connection. “Plural” includes two and is equivalent to at least two. The singular forms such as “a”, ‘said”, and “the” used in the present disclosure and the appended claims are also intended to include plural forms, unless the context clearly indicates otherwise. It is also to be understood that the term “and/or” as used herein refers to and includes any or all possible combinations of one or more associated listed items.

Embodiment 1

Figure 2A:
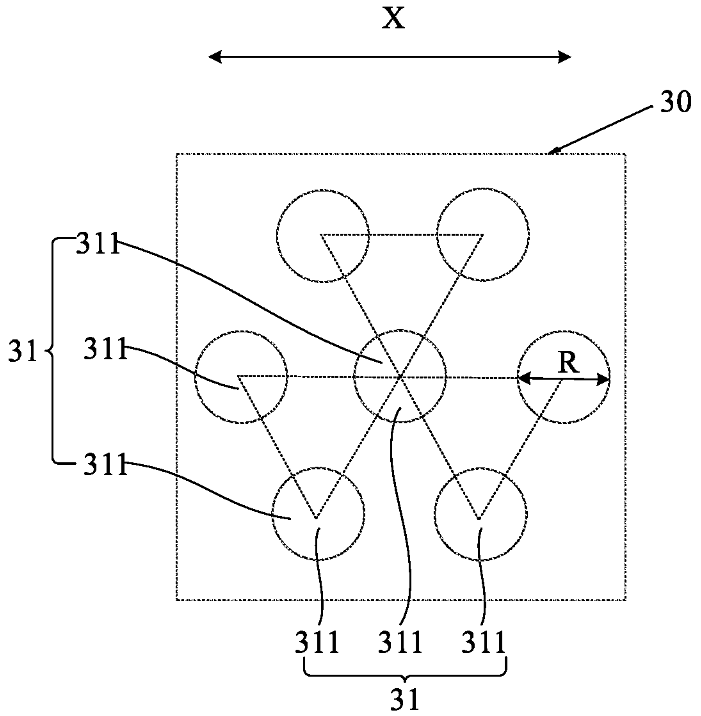
FIGS. 2(*a*) to 2(*c*) are schematic diagrams illustrating a sectional structure of a stacked structure of a semiconductor structure along a horizontal direction according to the embodiment 1 of the present disclosure.
Figure 2B:
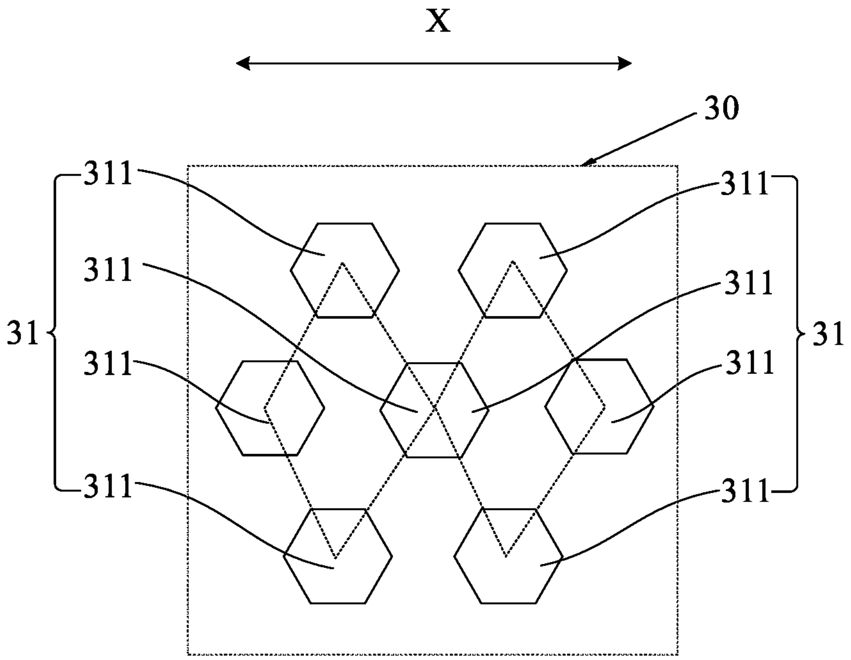
Figure 2C:
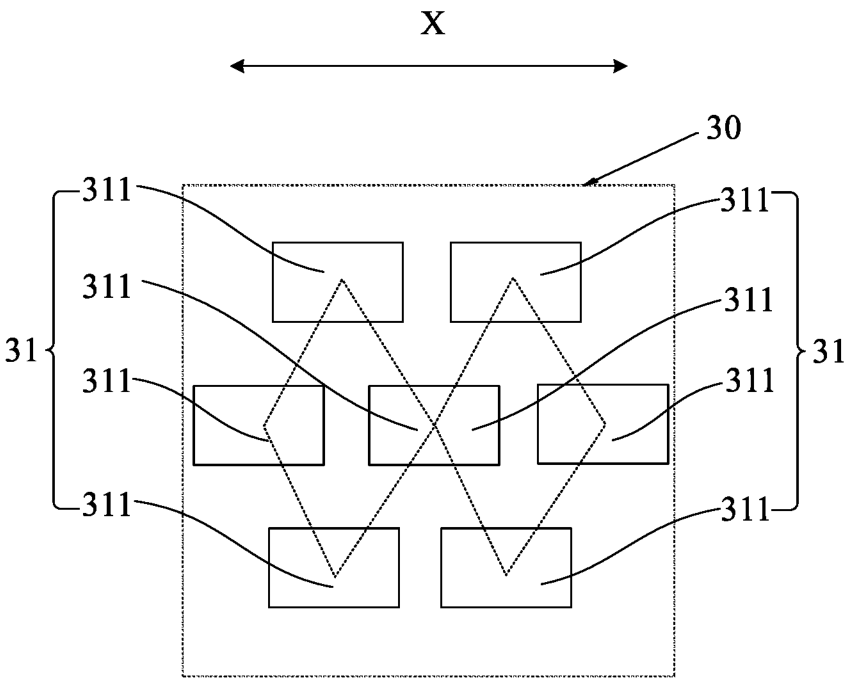
Figure 3A:
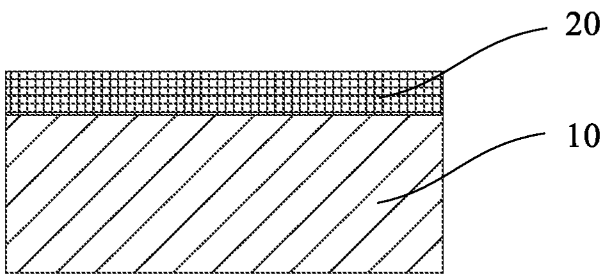
FIGS. 3(*a*) to 3(*d*) are process flowcharts illustrating a method of manufacturing the semiconductor structure according to the embodiment 1 of the present disclosure.
Figure 3B:
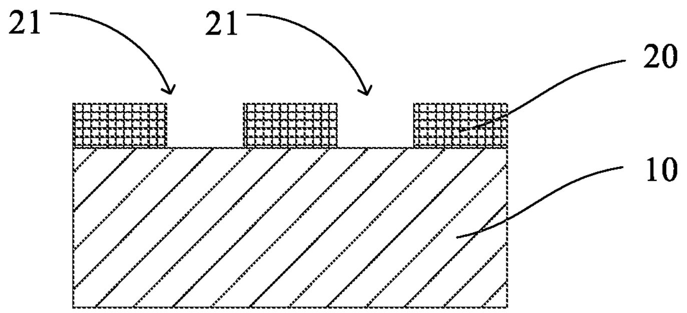
Figure 3C:
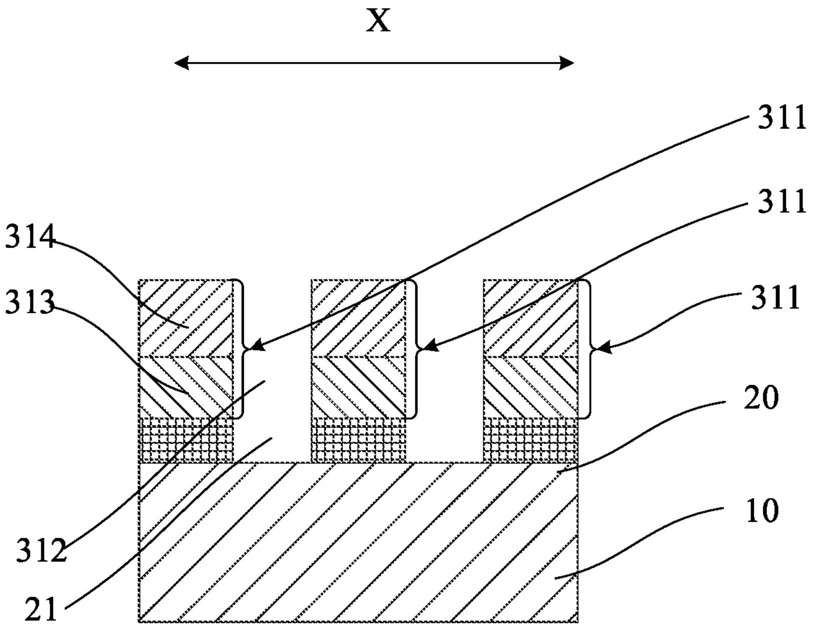
Figure 3D:
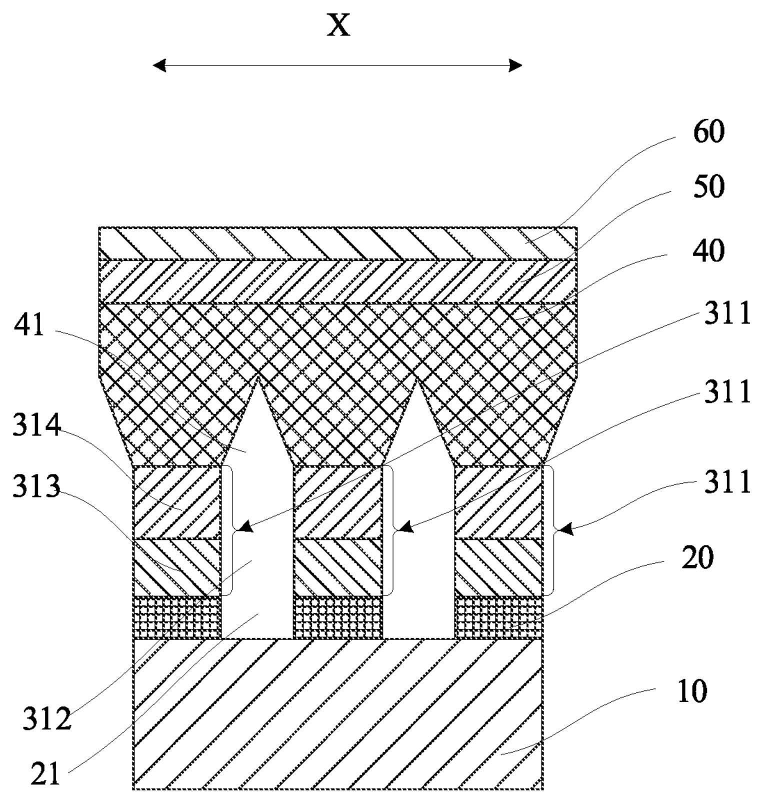

As shown in FIGS. 1 and 2(*a*) to 2(*c*), this embodiment provides a semiconductor structure. The semiconductor structure includes a substrate 10, a nucleation layer 20 disposed on the substrate 10 and a stacked structure 30 disposed on the nucleation layer 20.

The stacked structure 30 includes three stacked structure units 31 disposed along a horizontal direction X. The stacked structure units 31 are the smallest repeating units to form the stacked structure 30, namely, the stacked structure units 31 are the smallest repeatable units of the stacked structure 30. In other embodiments, the stacked structure 30 may include only one stacked structure unit 31, or include two stacked structure units 31 or four stacked structure units 31 or another number of stacked structure units 31.

Each stacked structure unit 31 includes a plurality of stacked island structures 311 separated from each other along the horizontal direction X. In an embodiment, each stacked structure unit 31 includes at least three stacked island structures 311 which are separated from each other along the horizontal direction X. The semiconductor structure further includes an N-type semiconductor layer 40, a light-emitting layer 50 and a P-type semiconductor layer 60 which are sequentially laminated on the stacked structure 30. The stacked structure 30, the N-type semiconductor layer 40, the light-emitting layer 50 and the P-type semiconductor layer 60 are manufactured by an epitaxial process.

The nucleation layer 20 is provided with grooves 21 to form a plurality of nucleation-layer-middle-islands separated from each other along the horizontal direction X, where each stacked island structure 311 corresponds to one nucleation-layer-middle-island.

A gap 312 is present between adjacent stacked island structures 311. A recess 41 concaved away from the stacked structure 30 is further formed at a side of the N-type semiconductor layer 40 in contact with the stacked structure 30, where the recess 41 is formed corresponding to the gap 312.

A material of the substrate 10 is sapphire, silicon, silicon carbide or gallium nitride, and a material of the nucleation layer 20 is AlN.

In this embodiment, the stacked structure 30 is a structure laminated with multiple layers of materials, namely, the stacked island structure 311 includes a buffer layer 313 and a first semiconductor layer 314 sequentially laminated. A material of the first semiconductor layer 314 is group-III nitride.

A shape of the section of the stacked island structures 311 may be a circle, or polygon. As shown in FIG. 2(*a*), the shape of the section of the stacked island structure 311 is a circle. If the section of the stacked island structure 311 is a circle, a diameter R of the section of the stacked island structure 311 is less than or equal to 50 μm. As shown in FIG. 2(*a*), in this embodiment, the stacked structure 30 includes three stacked structure units 31; each stacked structure unit 31 includes three stacked island structures 311 which are separated from each other along the horizontal direction X. Adjacent stacked structure units 31 may share one stacked island structure 311 to achieve partial overlap. The present disclosure is not limited hereto, adjacent stacked structure units 31 may also share two stacked island structures 311 to achieve partial overlap, or adjacent stacked structure units 31 may not be overlapped with each other, that is, separated from each other.

When the shape of the section of the stacked island structures 311 is a polygon, for example, the shape of the section of the stacked island structures 311 is a hexagon as shown in FIG. 2(*b*). The disclosure is not limited hereto, the shape of the section of the stacked island structure 311 may also be another polygon. As shown in FIG. 2(*c*), the shape of the section of the stacked island structures 311 is a rectangle. Alternatively, the shape of the section of the stacked island structures 311 may also be another polygon such as triangle, quadrilateral, hexagon, or the like, and a minimum circumcircle of the section of the stacked island structure 311 has a diameter of less than or equal to 50 μm.

Similarly, as shown in FIG. 2(*b*), in this embodiment, the stacked structure 30 includes two stacked structure units 31, and each stacked structure unit 31 includes four stacked island structures 311 separated from each other along the horizontal direction X. Adjacent stacked structure units 31 may share one stacked island structure 311 to achieve partial overlap. The implementation of FIG. 2(*c*) is same as the implementation of FIG. 2(*b*) and thus will not be repeated herein.

It is to be noted that the dotted line in FIGS. 2(*a*) to 2(*c*) is used to better show the structure of the stacked structure 30 and is not truly present.

FIGS. 3(*a*) to 3(*d*) show a process flowchart illustrating a method of manufacturing the semiconductor structure according to the embodiment 1 of the present disclosure. The manufacturing method includes the following steps.

At step S100, as shown in FIG. 3(*a*), a nucleation layer 20 is formed on a substrate 10 along a vertical direction Y. A material of the substrate 10 is sapphire, silicon, silicon carbide or gallium nitride, and a material of the nucleation layer 20 is AlN.

At step S200, as shown in FIG. 3 (*b*), grooves 21 are formed in the nucleation layer to form a plurality of nucleation-layer-middle-islands separated from each other along the horizontal direction X.

At step S300, as shown in FIG. 3 (*c*), a plurality of stacked island structures 311 separated from each other along the horizontal direction X are formed on the nucleation layer where each stacked island structure 311 is formed on each nucleation-layer-middle-island. The stacked island structure 311 includes a buffer layer 313 and a first semiconductor layer 314 sequentially laminated. A material of the first semiconductor layer 314 is group-III nitride.

A shape of the section of the stacked island structure 311 may be a circle, or polygon. If the shape of the section of the stacked island structure 311 is a circle, a diameter of the section of the stacked island structure 311 is less than or equal to 50 μm. When the shape of the section of the stacked island structure 311 is a polygon, for example, the shape of the section of the stacked island structures 311 is a hexagon. The present disclosure is not limited hereto, the shape of the section of the stacked island structure 311 may also be another polygon, and a minimum circumcircle of the section of the stacked island structure 311 has a diameter of less than or equal to 50 μm. The stacked structure 30 may be manufactured by an epitaxial process.

At step S400, as shown in FIG. 3(*d*), an N-type semiconductor layer 40, a light-emitting layer 50 and a P-type semiconductor layer 60 are laminated sequentially on the plurality of stacked island structures 311. The N-type semiconductor layer 40, the light-emitting layer 50 and the P-type semiconductor layer 60 are manufactured by an epitaxial process.

In the semiconductor structure of this embodiment, the stacked structure is provided in which the stacked island structures are disposed in different arrangement periods to achieve selective reflection on light. Since the stacked island structures enable the stacked structure to have a photonic energy band structure, the color of the reflected light changes due to different energy gap positions, so as to finally improve the light-emitting efficiency of the semiconductor structure.

Embodiment 2

Figure 4:
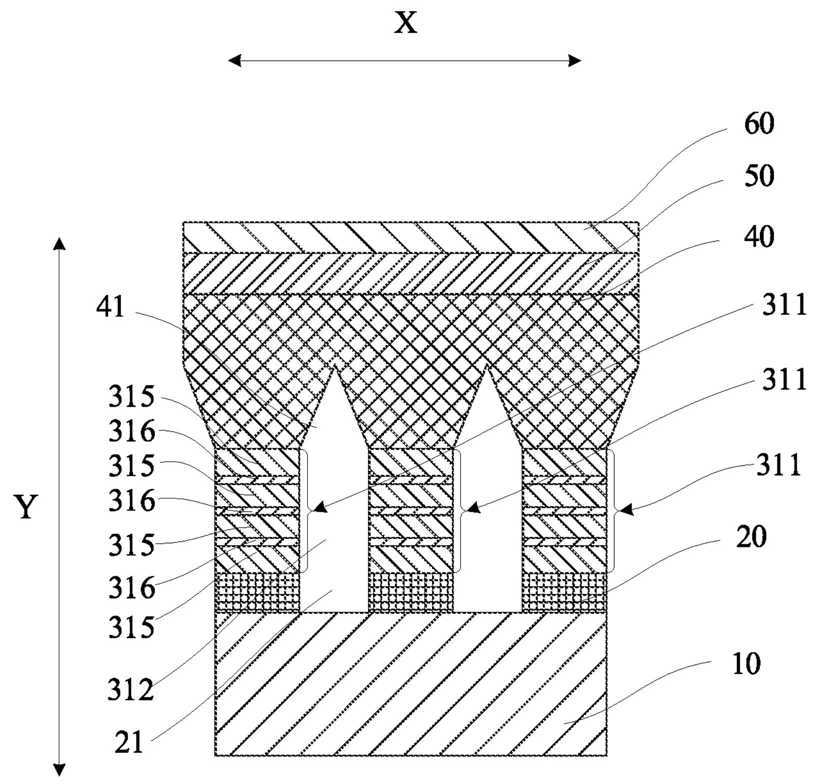
FIG. 4 is a schematic diagram illustrating a sectional structure of a semiconductor structure along a vertical direction according to an embodiment 2 of the present disclosure.

As shown in FIG. 4, this embodiment further provides a semiconductor structure. The semiconductor structure has a basically same structure as the semiconductor structure in the embodiment 1. In this embodiment, the stacked island structure 311 include second semiconductor layers 315 and third semiconductor layers 316 alternately laminated, where two opposed sides of the stacked island structure 311 along a vertical direction Y are provided with the second semiconductor layers 315.

A material of the second semiconductor layers 315 is $Al_{x1}In_{y1}Ga_{1-x1-y1}$, and a material of the third semiconductor layers 316 is $Al_{x2}In_{y2}Ga_{1-x2-y2}N$, where X1, Y1, X2 and Y2 are valued from 0 to 1.

Figure 5A:
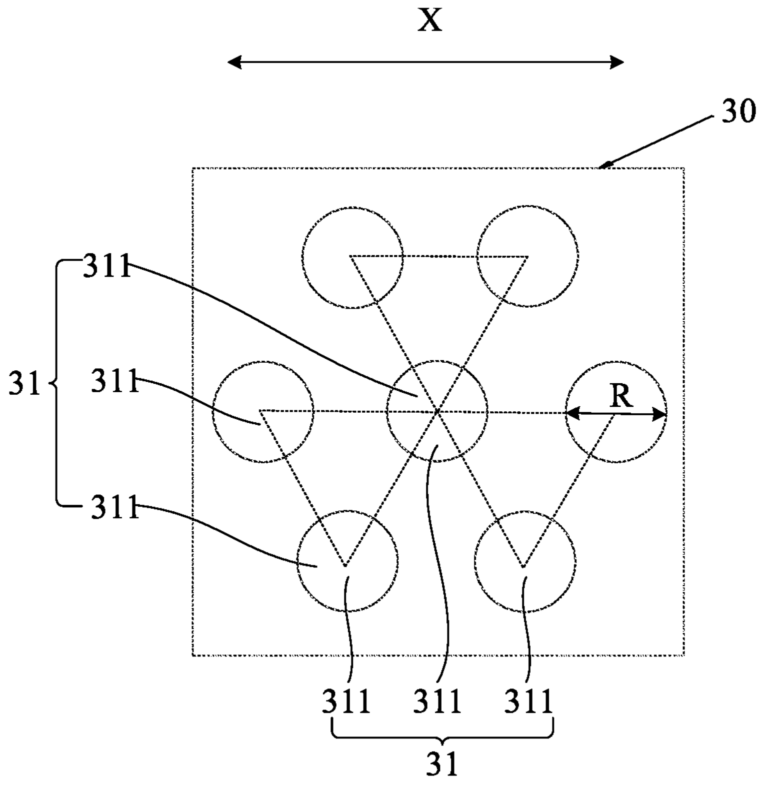
FIGS. 5(*a*) to 5(*c*) are schematic diagrams illustrating a sectional structure of a stacked structure of a semiconductor structure along a horizontal direction according to the embodiment 2 of the present disclosure.
Figure 5B:
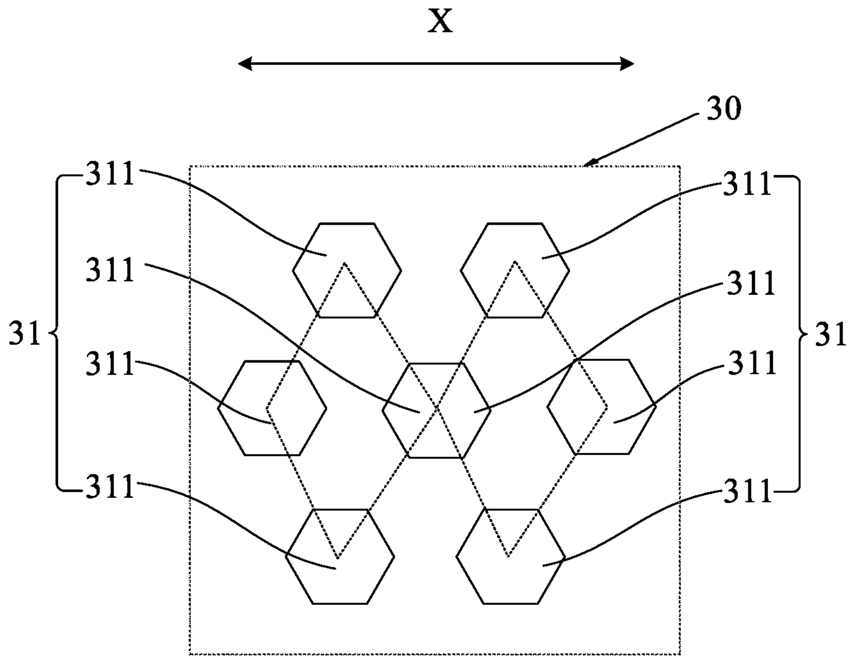
Figure 5C:
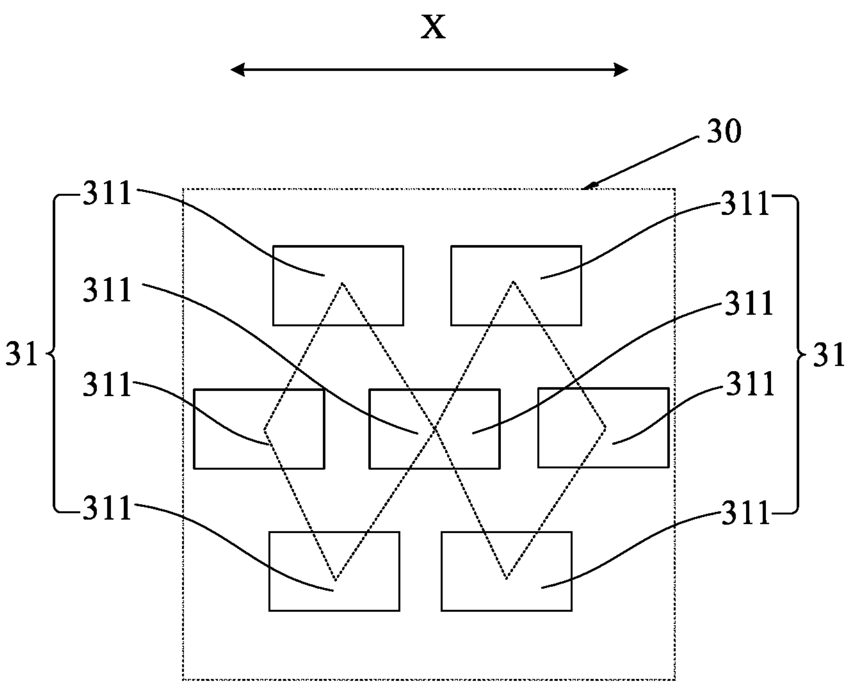

A shape of the section of the stacked island structure 311 may be a circle or polygon. As shown in FIG. 5(*a*), the shape of the section of the stacked island structure 311 is a circle, the section of the stacked island structure 311 has a diameter of less than or equal to 50 μm.

As shown in FIG. 5 (*a*), in this embodiment, the stacked structure 30 includes three stacked structure units 31, and each stacked structure unit 31 includes three stacked island structures 311 which are separated from each other along a horizontal direction X. Adjacent stacked structure units 31 may share one stacked island structure 311 to achieve partial overlap. The present disclosure is not limited hereto, the adjacent stacked structure units 31 may share two stacked island structures 311 to achieve partial overlap, or the adjacent stacked structure units 31 may not be overlapped with each other, namely, separated from each other.

When the shape of the section of the stacked island structure 311 is a polygon, for example, the shape of the section of the stacked island structure 311 is a hexagon, as shown in FIG. 5(*b*). The present disclosure is not limited hereto, the shape of the section of the stacked island structure 311 may also be another polygon. As shown in FIG. 5(*c*), the shape of the section of the stacked island structures 311 is a quadrilateral or another polygon such as triangle, hexagon or the like. A minimum circumcircle of the section of the stacked island structure 311 has a diameter of less than or equal to 50 μm.

Similarly, as shown in FIG. 5(*b*), in this embodiment, the stacked structure 30 includes two stacked structure units 31, and each stacked structure unit 31 includes four stacked island structures 311 separated from each other along the horizontal direction X. Adjacent stacked structure units 31 may share one stacked island structure 311 to achieve partial overlap. The implementation of FIG. 5(*c*) is same as the implementation of FIG. 5(*b*) and thus will not be repeated herein.

It is to be noted that the dotted line in FIGS. 5(*a*) to 5(*c*) is used to better show the structure of the stacked structure 30 and is not truly present.

Figure 6A:
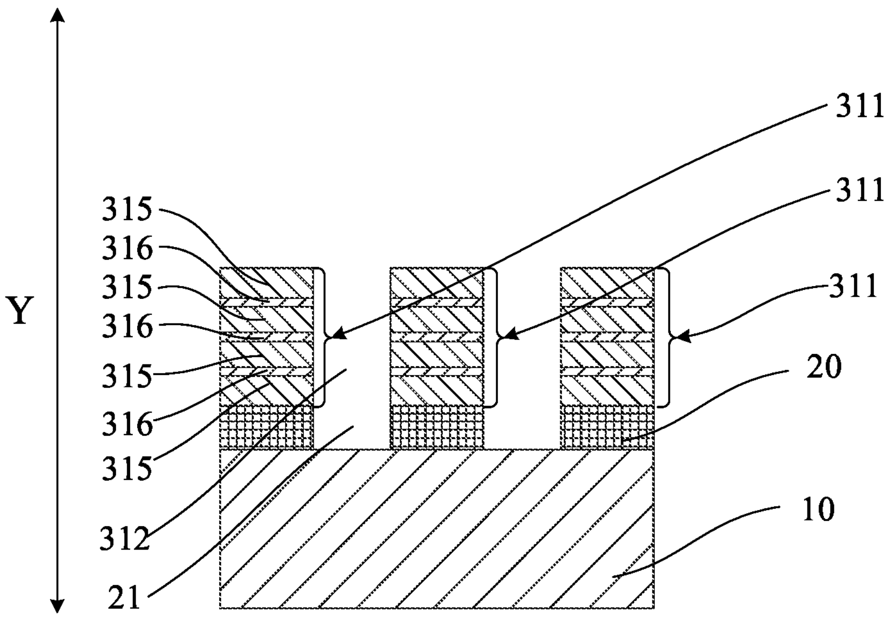
FIGS. 6(*a*) to 6(*b*) are process flowcharts illustrating a method of manufacturing the semiconductor structure according to the embodiment 2 of the present disclosure.
Figure 6B:
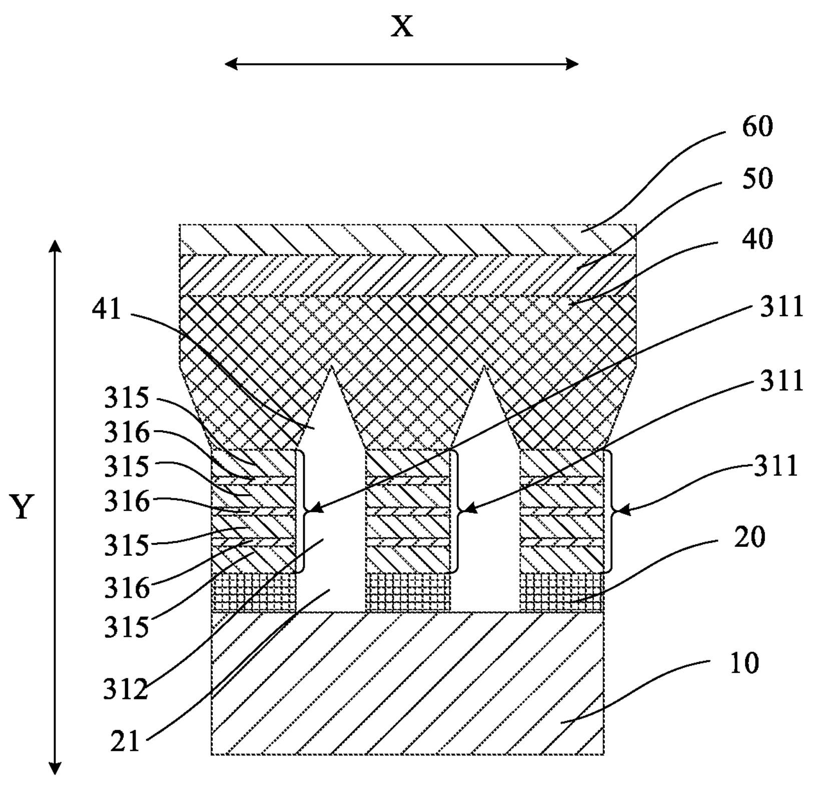

As shown in FIGS. 6(*a*) to 6(*b*), according to another aspect of this embodiment, there is further provided a method of manufacturing a semiconductor structure to manufacture the above semiconductor structure. The manufacturing method is basically same as the manufacturing method of the embodiment 1 except the following differences.

In the step S300, as shown in FIG. 6(*a*), the stacked island structure 311 includes second semiconductor layers 315 and third semiconductor layers 316 alternately laminated, where two opposed sides of the stacked island structure 311 along the vertical direction Y are provided with the second semiconductor layers 315. A material of the second semiconductor layers 315 is $Al_{x1}In_{y1}Ga_{1-x1-y1}$, and a material of the third semiconductor layers 316 is $Al_{x2}In_{y2}Ga_{1-x2-y2}N$, where X1, Y1, X2 and Y2 are valued from 0 to 1.

In the step S400, as shown in FIG. 6(*b*), an N-type semiconductor layer 40, a light-emitting layer 50 and a P-type semiconductor layer 60 are laminated sequentially on the plurality of stacked island structures 311.

Embodiment 3

Figure 7:
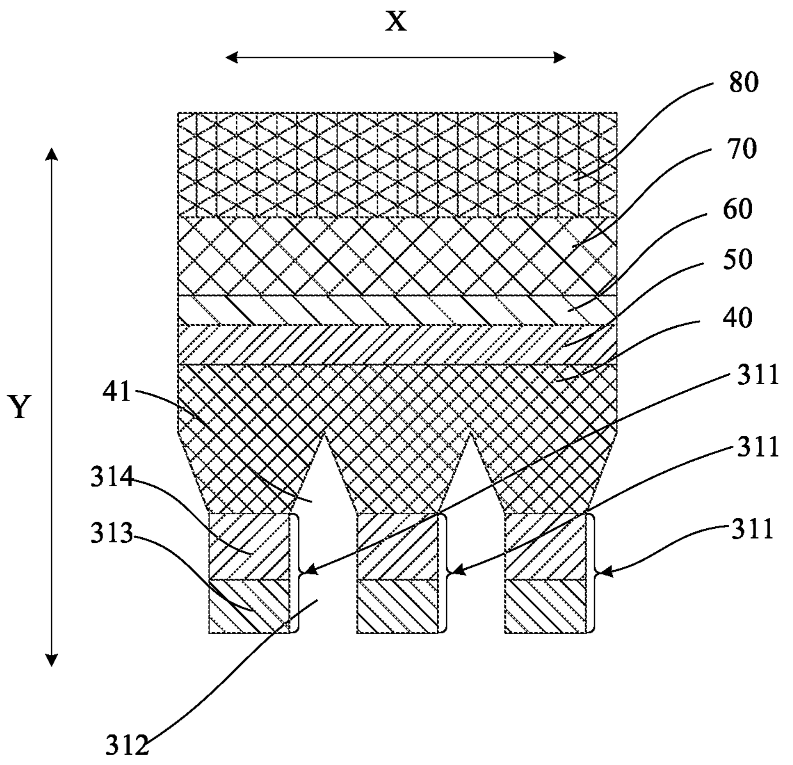
FIG. 7 is a schematic diagram illustrating a sectional structure of a semiconductor structure along a vertical direction according to an embodiment 3 of the present disclosure.

As shown in FIG. 7, this embodiment further provides a semiconductor structure, which has basically same structure as the semiconductor structure in the embodiment 1, except the following differences that: the semiconductor structure does not include the substrate 10 and the nucleation layer 20 but a reflection layer 70 and a transfer layer 80.

Along the vertical direction Y, the reflection layer 70 is disposed at a side of the P-type semiconductor layer 60 away from the light-emitting layer 50. Along the vertical direction Y, the transfer layer 80 is disposed at a side of the reflection layer 70 away from the P-type semiconductor layer 60. The reflection layer 70 and the transfer layer 80 are manufactured by a chip process.

In an embodiment, the reflection layer 70 may be a metal layer. For example, a material of the metal layer is Ag. Alternatively, the metal layer includes a first metal layer and a second metal layer laminated, where a material of the first metal layer is Ni and a material of the second metal layer is Ag. The present disclosure is not limited hereto, in other embodiments, the reflection layer 70 includes an indium tin oxide layer and/or distributed Bragg reflection (DBR) layer laminated, where the DBR layer is formed by laminating first material layers made of titanium oxide and second material layers made of silicon oxide alternately.

Figure 8A:
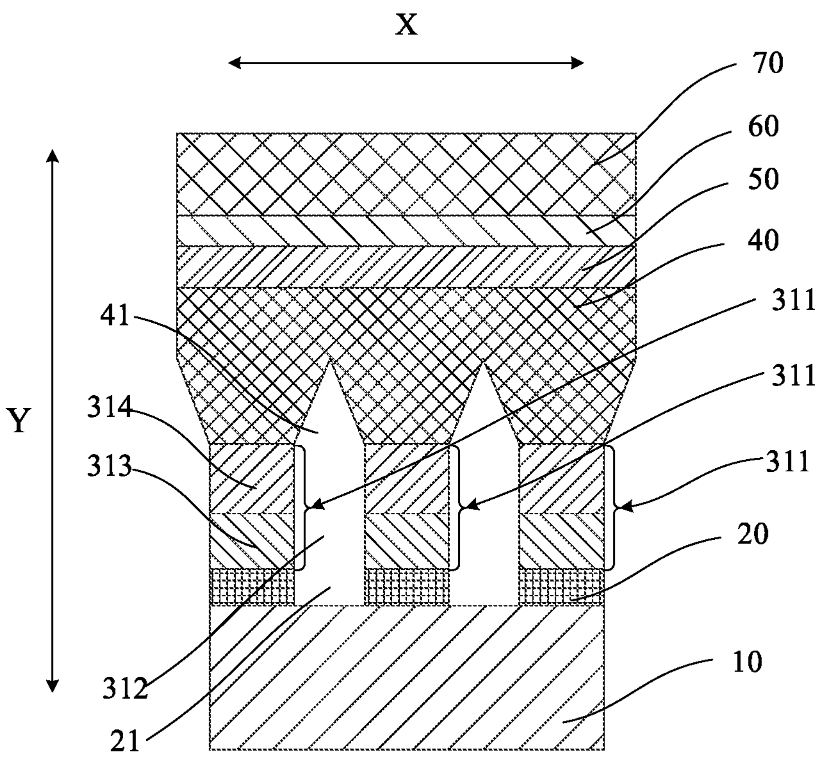
FIGS. 8(*a*) to 8(*c*) are process flowcharts illustrating a method of manufacturing the semiconductor structure according to the embodiment 3 of the present disclosure.
Figure 8B:
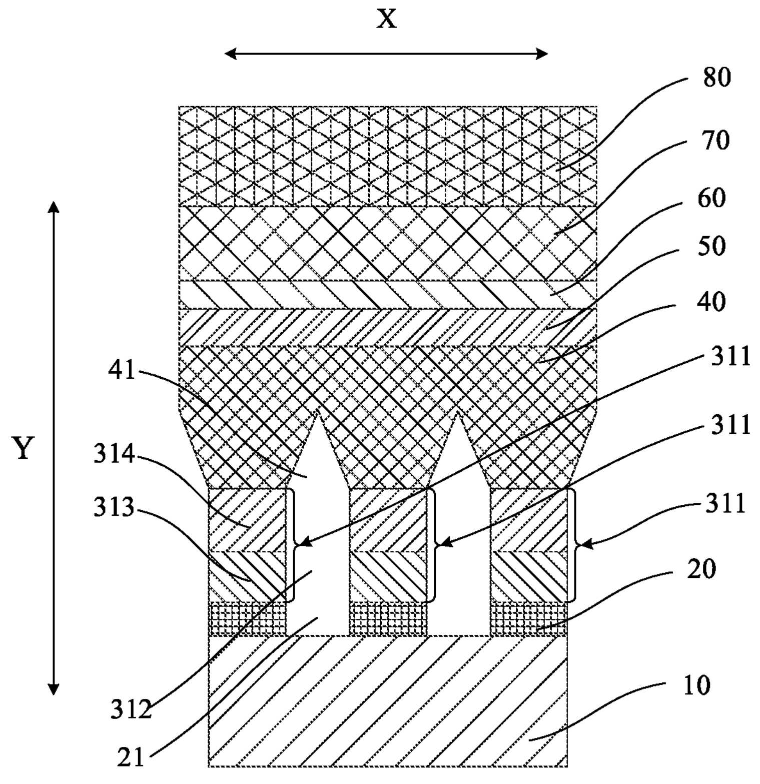
Figure 8C:
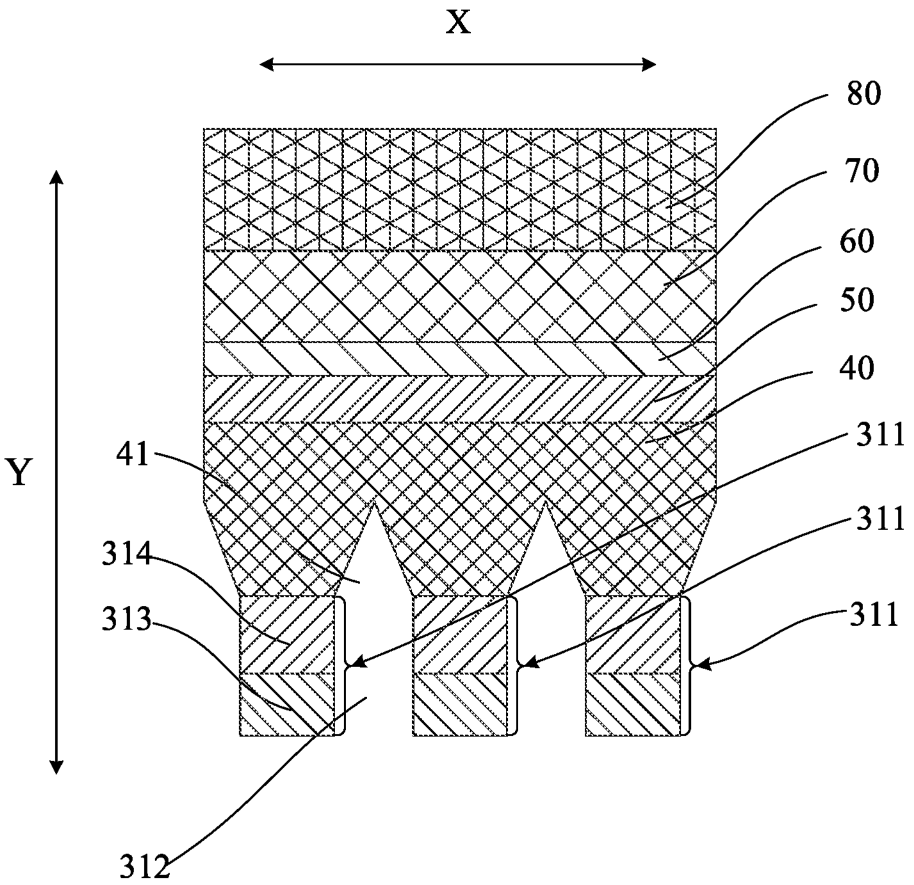

As shown in FIGS. 8(*a*) to 8(*c*), according to another aspect of the present embodiment, there is further provided a method of manufacturing a semiconductor structure to manufacture the above semiconductor structure. The manufacturing method includes, in addition to all steps of the manufacturing method of the embodiment 1, the following steps.

At step S600, as shown in FIG. 8(*a*), a reflection layer 70 is formed on the P-type semiconductor layer 60, where the reflection layer is manufactured by a chip process. In an embodiment, the reflection layer 70 is a metal layer. For example, a material of the metal layer is Ag. Alternatively, the metal layer includes a first metal layer and a second metal layer laminated, where a material of the first metal layer is Ni and a material of the second metal layer is Ag. The present disclosure is not limited hereto, in other embodiments, the reflection layer 70 includes an indium tin oxide layer and a DBR layer laminated, where the DBR layer is formed by laminating first material layers made of titanium oxide and second material layers made of silicon oxide alternately.

At step S700, as shown in FIG. 8(*b*), a transfer layer 80 is formed on the reflection layer 70, where the transfer layer 80 is manufactured by a chip process.

At step S800, as shown in FIG. 8(*c*), the nucleation layer 20 and the substrate 10 are removed.

The stacked structure of the semiconductor structure in this embodiment is not limited to one-dimensional stacked structure and may also be a two-dimensional stacked structure or a three-dimensional stacked structure. The above descriptions are made only to preferred embodiments of the present disclosure and are not intended to limit the present disclosure. Any changes, equivalent substitutions and improvements made within the spirit and principle of the present disclosure shall all fall within the scope of protection of the present disclosure.

The invention claimed is:

1. A semiconductor structure, comprising:

a stacked structure, comprising stacked structure units disposed along a horizontal direction, wherein each of the stacked structure units comprises stacked island structures separated from each other along the horizontal direction; and an N-type semiconductor layer, a light-emitting layer and a P-type semiconductor layer sequentially laminated on the stacked structure;

wherein a gap is present between the stacked island structures that are adjacent to each other, and a recess concaved away from the stacked structure is further formed at a side of the N-type semiconductor layer in contact with the stacked structure, wherein the recess is formed corresponding to the gap, and the recess and the gap are in communication;

wherein one of the stacked island structures comprises a buffer layer and a first semiconductor layer sequentially laminated; or wherein one of the stacked island structures comprises second semiconductor layers and third semiconductor layers laminated alternately;

wherein the stacked island structures are disposed in different arrangement periods, and have a photonic energy band structure.

2. The semiconductor structure of claim 1, wherein the stacked structure is a photonic crystal structure.

3. The semiconductor structure of claim 1, wherein the adjacent stacked structure units are partially overlapped; or the adjacent stacked structure units are separated from each other.

4. The semiconductor structure of claim 1, wherein a material of the second semiconductor layers is $Al_{x1}In_{y1}Ga_{1-x1-y1}N$, and a material of the third semiconductor layers is $Al_{x2}In_{y2}Ga_{1-x2-y2}N$, wherein X1, Y1, X2 and Y2 are valued from 0 to 1.

5. The semiconductor structure of claim 1, wherein the stacked structure units are smallest repeating units to form the stacked structure; and each of the stacked structure units comprises at least three stacked island structures separated from each other along the horizontal direction.

6. The semiconductor structure of claim 1, wherein a shape of a section of one of the stacked island structures is a circle or a polygon.

7. The semiconductor structure of claim 6, wherein, if the section of the one of the stacked island structures is a circle, the section of the one of the stacked island structures has a diameter of less than or equal to 50 μm;

if the section of the one of the stacked island structures is a polygon, a minimum circumcircle of the section of the one of the stacked island structures has a diameter of less than or equal to 50 μm.

8. The semiconductor structure of claim 1, wherein the stacked structure, the N-type semiconductor layer, the light-emitting layer and the P-type semiconductor layer are manufactured by an epitaxial process.

9. The semiconductor structure of claim 1, further comprising a substrate and a nucleation layer;

along a vertical direction, the nucleation layer is disposed between the substrate and the stacked structure and provided with grooves to form a plurality of nucleation-layer-middle-islands separated from each other along the horizontal direction, wherein each stacked island structure corresponds to one nucleation-layer-middle-island.

10. The semiconductor structure of claim 9, wherein a material of the substrate is sapphire, silicon, silicon carbide or gallium nitride.

11. The semiconductor structure of any one of claim 1, further comprising:

a reflection layer, wherein along the vertical direction, the reflection layer is disposed at a side of the P-type semiconductor layer away from the light-emitting layer; and a transfer layer, wherein along the vertical direction, the transfer layer is disposed at a side of the reflection layer away from the P-type semiconductor layer.

12. The semiconductor structure of claim 11, wherein the reflection layer and the transfer layer are manufactured by a chip process.

13. The semiconductor structure of claim 11, wherein the reflection layer is a metal layer.

14. The semiconductor structure of claim 13, wherein a material of the metal layer is Ag; or the metal layer comprises a first metal layer and a second metal layer laminated, wherein a material of the first metal layer is Ni and a material of the second metal layer is Ag.

15. The semiconductor structure of claim 11, wherein the reflection layer comprises at least one of an indium tin oxide layer or a DBR layer laminated.

16. The semiconductor structure of claim 15, wherein the DBR layer is formed by alternately laminating first material layers made of titanium oxide and second material layers made of silicon oxide.

* * * * *